United States Patent
Shen et al.

(10) Patent No.: US 11,127,330 B1
(45) Date of Patent: Sep. 21, 2021

(54) SHIFT REGISTER ALLOWING NARROWER BEZEL AND DISPLAY APPARATUS BASED THEREON

(71) Applicant: Century Technology (Shenzhen) Corporation Limited, Shenzhen (CN)

(72) Inventors: Shuai Shen, Shenzhen (CN); Yan-Juan Zhang, Shenzhen (CN); Zhi-Rong Xie, Shenzhen (CN); Fang Chen, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 0 days.

(21) Appl. No.: 16/986,176

(22) Filed: Aug. 5, 2020

(30) Foreign Application Priority Data

Jun. 5, 2020 (CN) .......................... 202010504866.1

(51) Int. Cl.
*G09G 3/20* (2006.01)
*G09G 3/36* (2006.01)
*G11C 19/28* (2006.01)

(52) U.S. Cl.
CPC ............ *G09G 3/20* (2013.01); *G09G 3/3677* (2013.01); *G11C 19/28* (2013.01); *G11C 19/287* (2013.01); *G09G 2310/0202* (2013.01); *G09G 2310/0267* (2013.01); *G09G 2310/0286* (2013.01); *G09G 2310/08* (2013.01)

(58) Field of Classification Search
CPC ... G09G 2300/0408; G09G 2310/0286; G09G 2310/08; G09G 2310/0267; G09G 2310/061; G09G 3/3677; G09G 3/20; G09G 2310/0289; G11C 27/04; G11C 19/287; G02F 1/13454; G06F 3/0412; G06F 3/0416
See application file for complete search history.

(56) References Cited

U.S. PATENT DOCUMENTS

| | | | | |
|---|---|---|---|---|
| 9,418,755 | B2 * | 8/2016 | So ........................ | G09G 3/3677 |
| 10,127,875 | B2 * | 11/2018 | Wu ...................... | G09G 3/3677 |
| 10,547,316 | B2 * | 1/2020 | Takasugi ................ | H03K 21/18 |
| 10,679,564 | B2 * | 6/2020 | Jang ...................... | G09G 3/3674 |
| 2018/0040272 | A1 * | 2/2018 | Lin ........................ | G11C 19/28 |
| 2019/0147821 | A1 * | 5/2019 | Tagawa ................. | G06F 3/0416 345/173 |
| 2020/0202967 | A1 * | 6/2020 | Hu ........................ | G09G 3/3266 |
| 2020/0286570 | A1 * | 9/2020 | Shan .................... | G09G 3/2092 |

(Continued)

FOREIGN PATENT DOCUMENTS

CN 107633834 B 1/2018

*Primary Examiner* — Dismery Mercedes
(74) *Attorney, Agent, or Firm* — ScienBiziP, P.C.

(57) ABSTRACT

A shift register which allows narrower framing of a display screen includes cascade-connected shift register modules. Each shift register module is electrically coupled to first and second scan lines and outputs scanning signals to the first and the second scan lines in a time-division manner in response to first to fourth clock signals. Each shift register module includes an initial circuit, a reset circuit, a first output circuit, and a second output circuit. The initial circuit receives a trigger signal for activating the shift register module. The initial circuit controls the first output circuit to output a signal to the first scan line based on the first clock signal and controls the second output circuit to output a signal to the second scan line according to the second clock signal.

10 Claims, 7 Drawing Sheets

(56) References Cited

U.S. PATENT DOCUMENTS

2021/0090484 A1\* 3/2021 Shang .................... G11C 19/28
2021/0125564 A1\* 4/2021 Yuan ..................... G11C 19/28
2021/0134203 A1\* 5/2021 Wang ................... G09G 3/3266

\* cited by examiner

SHIFT REGISTER ALLOWING NARROWER BEZEL AND DISPLAY APPARATUS BASED THEREON

FIELD

The subject matter herein generally relates to a narrow bezel of display apparatus.

BACKGROUND

Displays are widely used in electronic device as an inputting and outputting device, for achieving a friendly communication feeling. Each display includes a display panel and a display driving circuit. The display panel includes a plurality of data lines and a plurality of scan lines intersecting the data lines. The display driving circuit is in a non-display region of the display. The driving circuit outputs different signals to the data lines and the scan lines for driving the display panel to display images. The driving circuit includes a gate driving circuit and a source driving circuit. The gate driving circuit can include a shift register with a plurality of shift register modules. Each shift register module corresponds to one scan line. In liquid crystal display technology, a display with a narrow bezel is desirable because the display panel with a narrow bezel is popular. However, as a number of pixels increases in the display panel, such a narrow bezel is hard to achieve.

Therefore, there is room for improvement in the art.

BRIEF DESCRIPTION OF THE FIGURES

Implementations of the present disclosure will now be described, by way embodiment, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The term "circuit" is defined as an integrated circuit (IC) with a plurality of electronic elements, such as capacitors, resistors, and the like.

The present disclosure relates to a shift register with a number of shift register modules in a display apparatus. Each shift register module outputs two signals in a time-division manner, thus a narrow bezel of the display apparatus is achieved.

Figure 1:
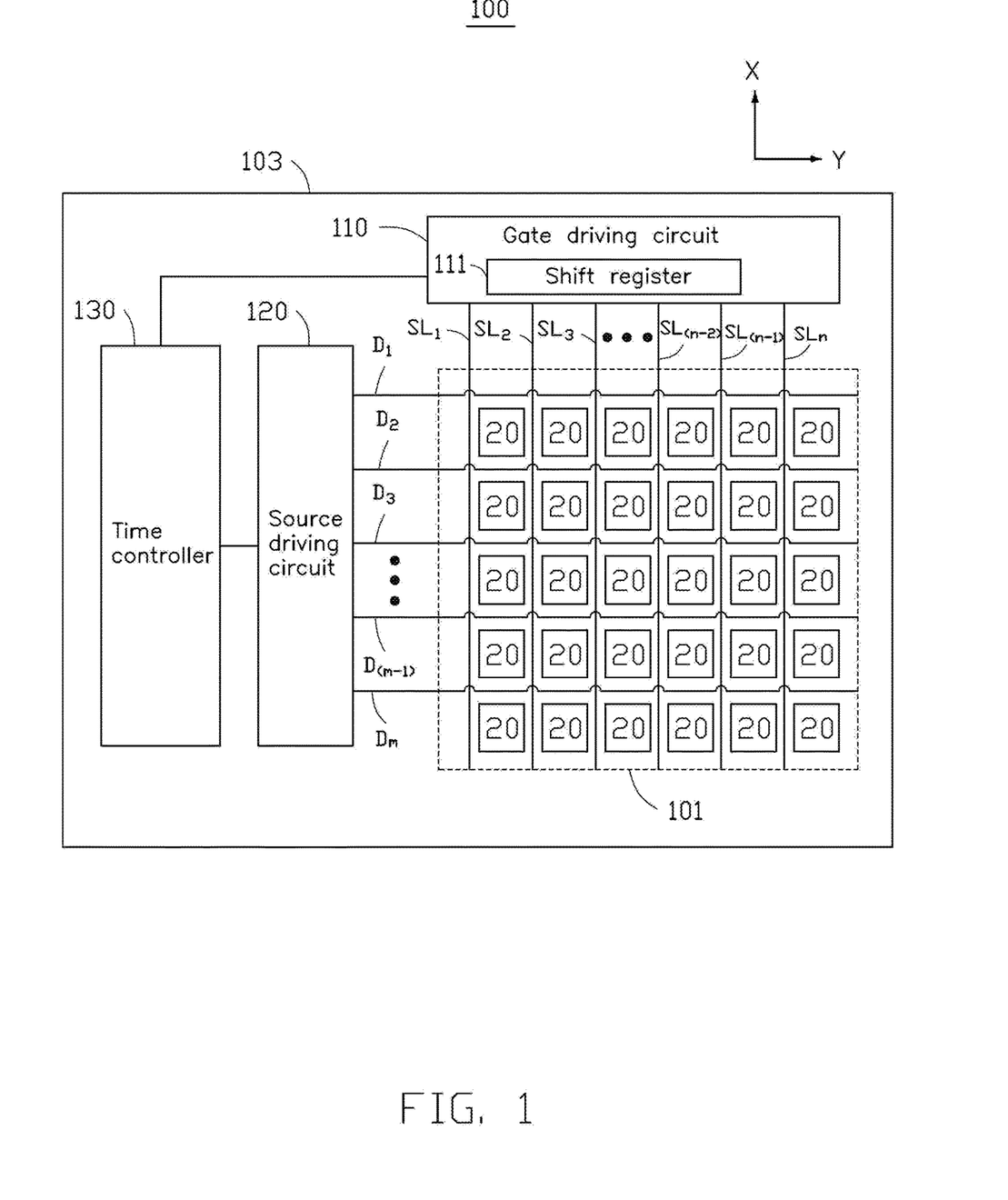
FIG. 1 is a diagram view of an embodiment of a display apparatus, the display apparatus includes a shift register.

FIG. 1 show a display apparatus 100. The display apparatus 100 defines a display region 101 and a non-display region 103 surrounding the display region 101. The display region 101 includes a number of scan lines $SL_1$-$SL_n$ and a number of data lines $D_1$-$D_m$. In one embodiment, n and m are positive integers. The scan lines $SL_1$-$SL_n$ are parallel with each other along a first direction X, and the data lines $D_1$-$D_m$ are parallel with each other along a second direction Y, direction Y being perpendicular to the first direction X. The scan lines $SL_1$-$SL_n$ are insulated from and are intersecting with the data lines $D_1$-$D_m$ to define a number of pixel units 20 in a matrix.

The display apparatus 100 includes a scan driving circuit 110, a data driving circuit 120, and a time controller 130. Each scan line $SL_i$ is electrically connected between the scan driving circuit 110 and the pixel units 20 in one line. Each data line $D_m$ is electrically connected between the data driving circuit 120 and the pixel units 20 in one column. The time controller 130 is electrically connected to the scan driving circuit 110 and the data driving circuit 120. The time controller 130 generates various control signals. The various control signals may include synchronization signals, such as a vertical synchronization (Vsync) signal, a horizontal synchronization (Hsync) signal, and a data enable (DE) signal, and non-synchronization signals. In one embodiment, the time controller 130 generates first to fourth clock signals VCK1-VCK4 to the shift register 110. Signals of the first to fourth clock signals VCK1-VCK4 are shifted in that order in a specified phase. The signals of the first to fourth clock signals VCK1-VCK4 do not overlap with each other in any time. The scan driving circuit 110 provides scan signals to the scan lines $SL_1$-$SL_n$ for scanning the pixel units 20, and the data driving circuit 120 provides data signals to the data lines $D_1$-$D_m$ for displaying images. In one embodiment, the scan driving circuit 110 is located on an upper side of the display region 101, and the data driving circuit 120 is located on a left side of the display region 101.

Figure 2:
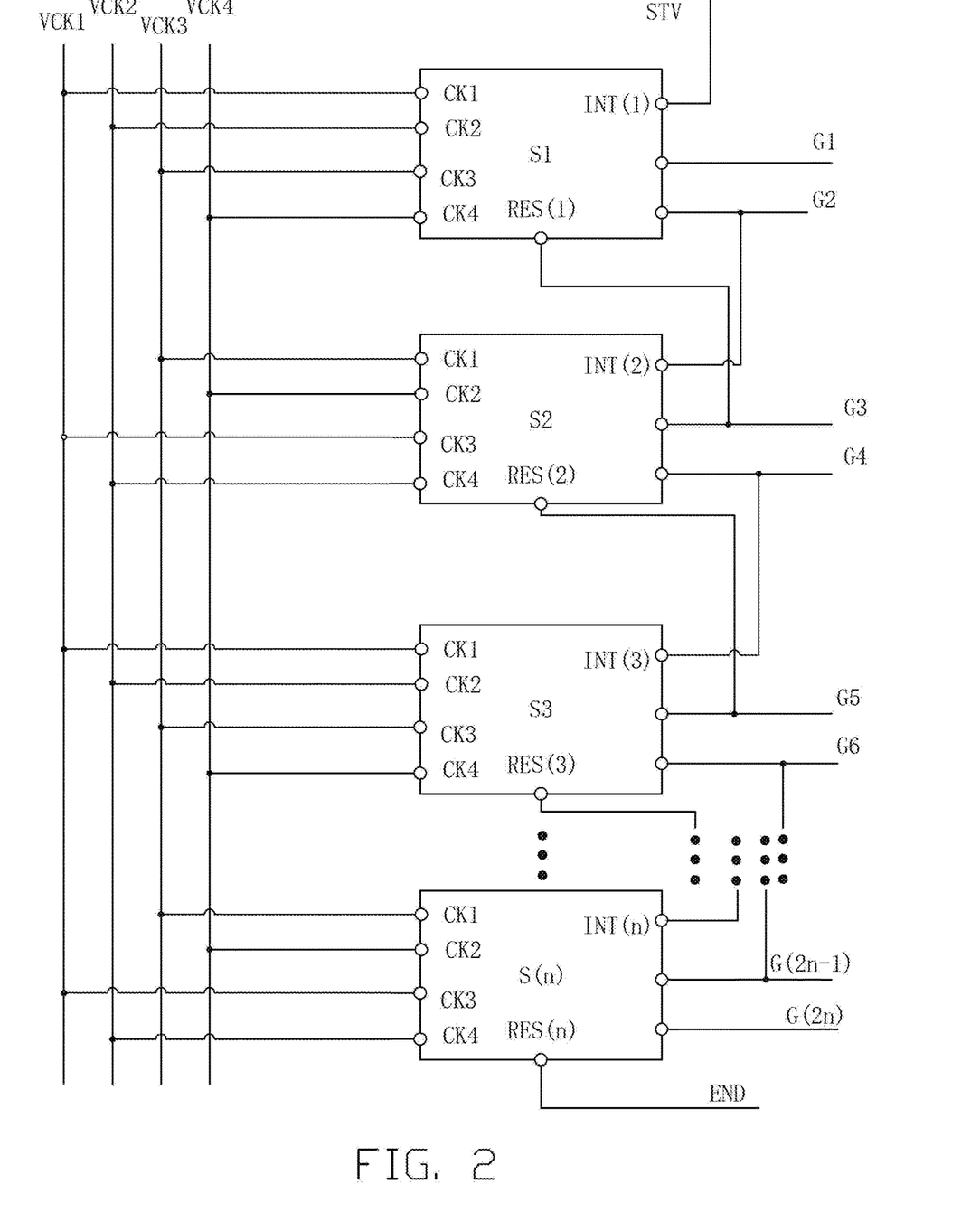
FIG. 2 is a diagram view of a first embodiment of the shift register of FIG. 1, the shift register includes a number of shift register modules.

The scan driving circuit 110 includes a shift register 111. FIG. 2 shows a first embodiment of the shift register 111. The shift register 111 includes a number of the shift register modules S1-S(n) connected in multiple stages. Each shift register module S(i) is electrically connected with two scan lines $SL_{(2i-1)}$-$SL_{(2i)}$ through a first output terminal G(2i-1) and a second output terminal G(2i) respectively. The first output terminal G(2i-1) is electrically connected to the scan line $SL_{(2i-1)}$, and the second output terminal G(2i) is electrically connected to the scan line $SL_{(2i)}$. Signals of the first output terminal G(2i-1) and the second output terminal G(2i) are not overlapped with each other. Each shift register module S(i) receives the first to fourth clock signals VCK1-VCK4 from the time controller 130. First to fourth clock terminals of odd shift register modules S1, S3, . . . , S(2n-1) are respectively electrically connected to the first to fourth clock signals VCK1-VCK4 in that order. The first to fourth clock terminals of even shift register modules S2, S4, . . . , S(2n) are respectively electrically connected to the third clock signal VCK3, the fourth clock signal VCK4, the first clock signal, and the second clock signal VCK2 in that order. It is understood that, an initial terminal INT1 of the first stage shift register module S1 receives a start signal STV. The signal outputted by the second output terminal OUT(2i) of each shift register module S(i) is provided to the initial terminal INT(i+1) of the following shift register module S(i+1) as an initial signal, and a reset terminal RES(i) of each shift register module S(i) is electrically connected to a first output terminal OUT(2i-3) of the anterior stage shift register module S(i-1) for receiving a reset signal. It is understood that, the reset terminal RES2 of the second stage shift register module S2 receives the reset signal from the first output terminal OUT1 of the first stage shift register module S1.

Figure 3:
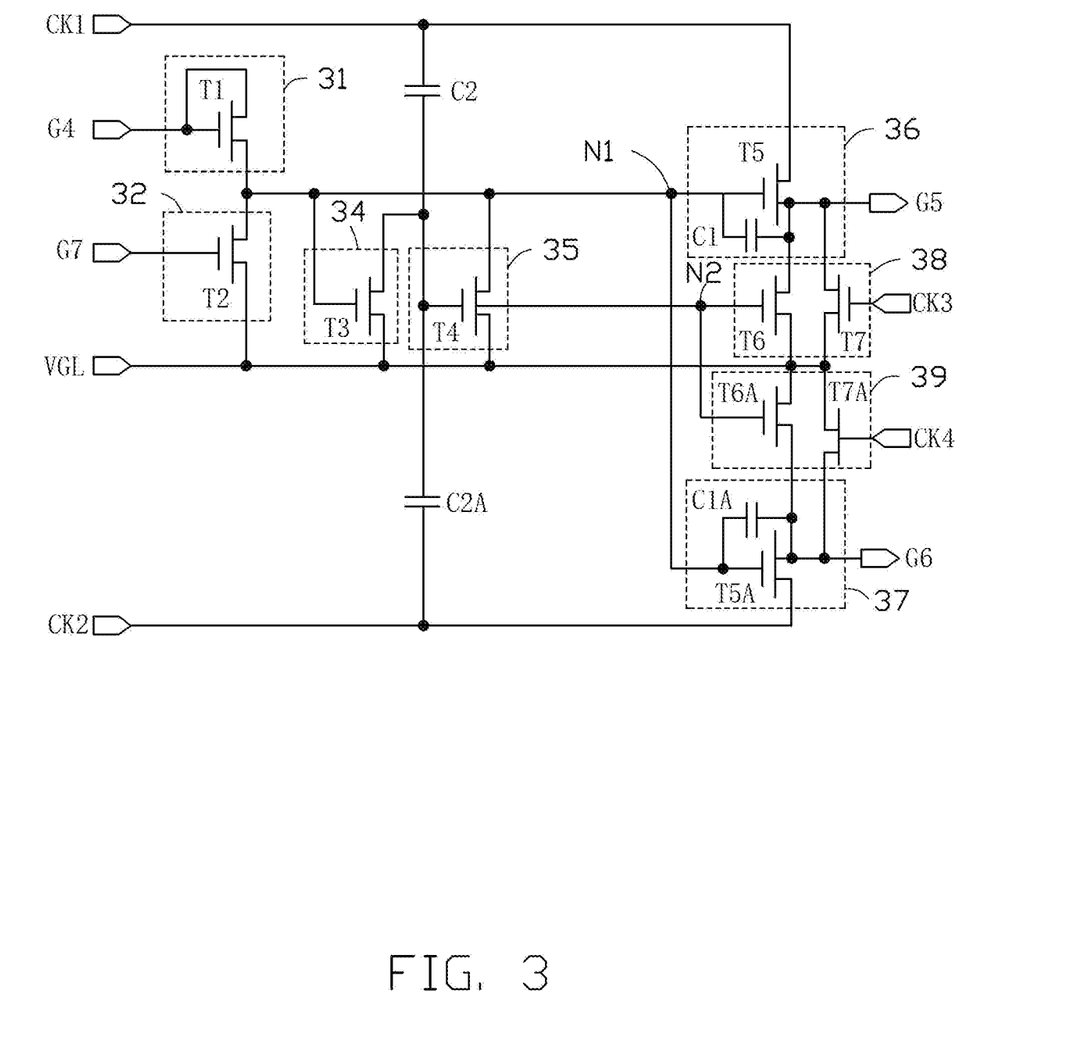
FIG. 3 is a circuit diagram view of the third stage shift register module of FIG. 2.

FIG. 3 shows a circuit diagram of the third stage shift register module S3. Each shift register module Si has same electrical structure and includes the same elements. The third stage shift register module S3 includes an initial circuit 31 with the initial terminal INT3, a reset circuit 32 with the reset terminal RES3, a first control circuit 34, a second control circuit 35, a first output circuit 36 with the first output terminal G5, a second output terminal G6, a first pull-down circuit 38, and a second pull-down terminal 39.

The initial circuit 31 receives the initial signal through the initial terminal INT3 for initiating the third stage shift register module S3. The initial circuit 31 includes a first transistor T1. A control terminal of the first transistor T1 receives the signal of the second output terminal OUT4 of the anterior shift register module S2 as the initial signal. A first connection of the first transistor T1 is electrically connected to the first output circuit 36 and the second output terminal 37 through a first node N1. A second connection of the first transistor T1 is electrically connected to the first control terminal of the first transistor T1.

The reset circuit 32 receives the reset signal through the reset terminal RES3 for resetting the third stage shift register module S3. The reset circuit 32 includes a second transistor T2. A control terminal of the second transistor T2 receives the signal of the first output terminal OUT7 of the following fourth stage shift register module S4 as the reset signal. A first connection terminal of the second transistor T2 is electrically connected to a ground terminal VGL. A second connection terminal of the second transistor T2 is electrically connected to the first output circuit 36 and the second output terminal 37 through a first node N1. The first node N1 is electrically connected between the first connection terminal of the first transistor T1 and the second connection terminal of the second transistor T2.

The first control circuit 34 pulls down a voltage of a second node N2 connected between the first control 34 and the first pull-down circuit 38, when the voltage of the first node N1 is larger than a predetermined value. The first control circuit 34 includes a third transistor T3. A control terminal of the third transistor T3 is electrically connected to the first node N1. A first connection terminal of the third transistor T3 is electrically connected to the ground terminal VGL. A second connection terminal of the third transistor T3 is electrically connected to a first clock terminal CK1 through a first filter capacitor C2 and is further electrically connected to a second clock terminal CK2 through a second filter capacitor C2A.

The second control circuit 35 clamps the voltage of the first node N1 at the predetermined value based on the signals of the first clock terminal CK1 and the second clock terminal CK2. The second control circuit 35 includes a fourth transistor T4. A control terminal of the fourth transistor T4 is electrically connected to the second node N2, the first clock terminal CK1 through the first filter capacitor C2, and the second clock terminal CK2 through the second filter capacitor C2A. A first connection terminal of the fourth transistor T4 is electrically connected to the ground terminal VGL. A second connection terminal of the fourth transistor T4 is electrically connected to the first node N1.

The first output circuit 36 controls the first output terminal G5 to output a signal synchronously with the signal of the first clock terminal CK1, based on the signals of the initial terminal INT3 and the reset terminal RES3. The first output circuit 36 includes a fifth transistor T5 and a first capacitor C1. A first control terminal of the fifth transistor T5 is electrically connected to the first node N1. A first connection terminal of the fifth transistor T5 is electrically connected to the first clock terminal CK1. A second connection terminal of the fifth transistor T5 is electrically connected to the first output terminal G5 and the first pull-down circuit 38. Opposite terminals of the first capacitor C1 are respectively electrically connected to the first control terminal and the second connection terminal of the fifth transistor T5.

The first pull-down circuit 38 pulls down the voltage of the first output terminal G5 based on the voltage of the second node N2 and a signal of a third clock terminal CK3. The first pull-down circuit 38 includes a sixth transistor T6 and a seventh transistor T7. A first control terminal of the sixth transistor T6 is electrically connected to the second node N2. A first connection terminal of the sixth transistor T6 is electrically connected to the ground terminal VGL. A second connection terminal of the sixth transistor T6 is electrically connected to the first output terminal G5. A first control terminal of the seventh transistor T7 is electrically connected to the third clock terminal CK3. A first connection terminal of the seventh transistor T7 is electrically connected to the ground terminal VGL. A second connection terminal of the seventh transistor T7 is electrically connected to the first output terminal G5.

The second output circuit 37 controls the second output terminal G6 to output a signal synchronously with the signal of the second clock terminal CK2, based on the signals of the initial terminal INT3 and the reset terminal RES3. The second output circuit 37 includes an eighth transistor T5A and a second capacitor C1A. A first control terminal of the eighth transistor T5A is electrically connected to the first node N1. A first connection terminal of the eighth transistor T5A is electrically connected to the second clock terminal CK2. A second connection terminal of the eighth transistor T5A is electrically connected to the second output terminal G6 and the second pull-down circuit 39. Opposite terminals of the second capacitor C1A are respectively electrically connected to the first control terminal and the second connection terminal of the eighth transistor T5A.

The second pull-down circuit 39 pulls down the voltage of the second output terminal G6 based on the voltage of the second node N2 and a signal of a fourth clock terminal CK4. The second pull-down circuit 39 includes a ninth transistor T6A and a tenth transistor T7A. A first control terminal of the ninth transistor T6A is electrically connected to the second node N2. A first connection terminal of the ninth transistor T6A is electrically connected to the ground terminal VGL. A second connection terminal of the ninth transistor T6A is electrically connected to the second output terminal G6. A first control terminal of the tenth transistor T7A is electrically connected to the fourth clock terminal CK4. A first connection terminal of the tenth transistor T7A is electrically connected to the ground terminal VGL. A second connection terminal of the tenth transistor T7A is electrically connected to the second output terminal G6.

Figure 4:
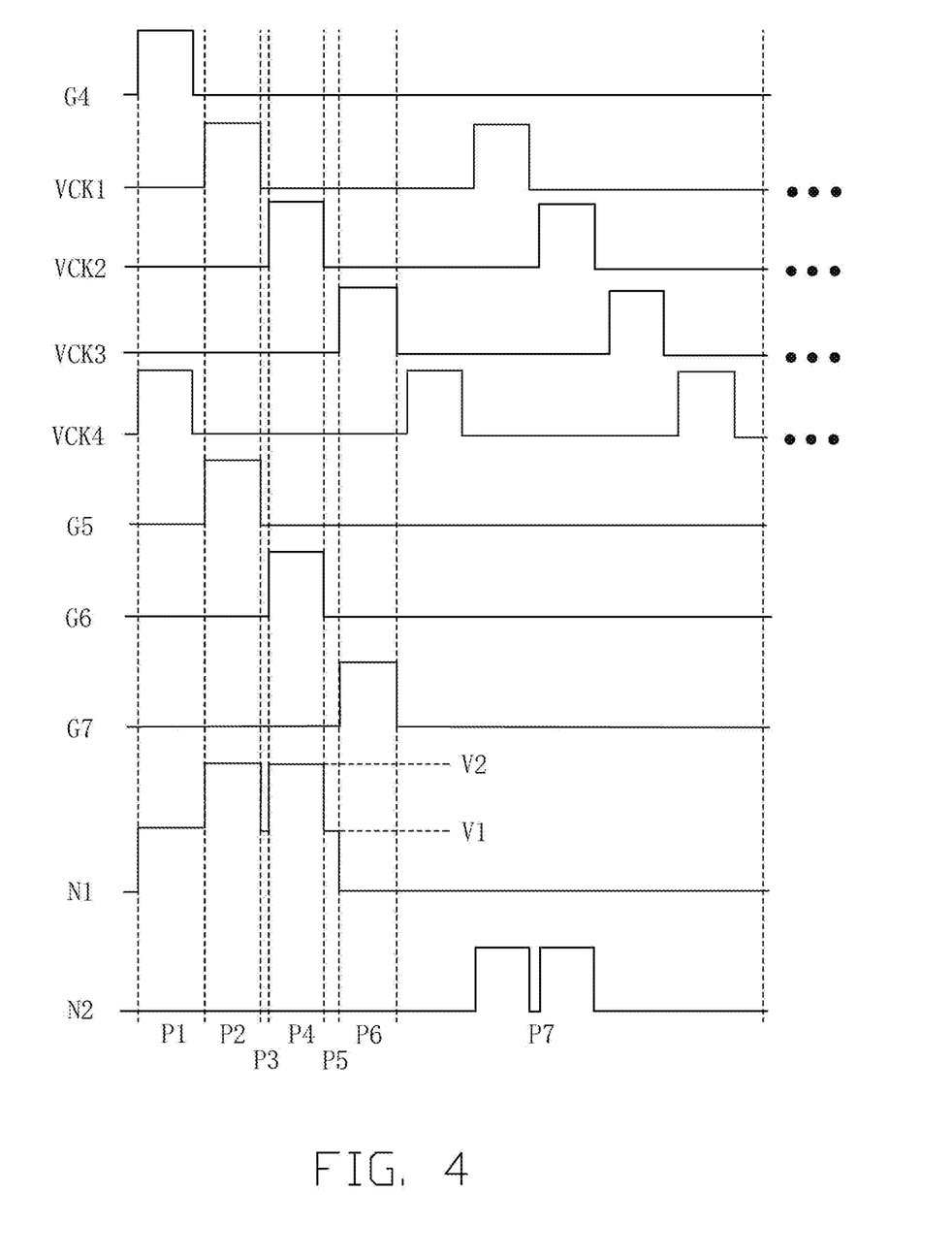
FIG. 4 is a timing chart showing waveforms of the third shift register module of FIG. 3.

Each shift register module S(i) operates under first to seventh periods P1-P7 in one frame. In the first to fourth periods P1-P4, the voltage of the first node N1 is larger than a threshold voltage of the third transistor T3, the third transistor T3 turns on, and the voltage of the second node N2 is clamped at the predetermined value. In one embodiment, the predetermined value is 0 volt. Thus, the high-level signals of the first clock terminal CK1 or the second clock terminal CK2 provided to the second node N2 in the second period P2 and the fourth period P4 fail to pull up the voltage of the second node N2. During the sixth period P6 and seventh period P7, the fourth transistor T4 turns on according to the signal of the first clock terminal CK1, and the voltage of the first node N1 is clamped at the predetermined value, to avoid the first output terminal G5 and the second output terminal G6 outputting noise. In one frame, the signals of the first to fourth clock terminals CK1-CK4 are shifted in order for several cycles. In each cycle, the signals of the first to fourth clock terminals CK1-CK4 are effective during a time duration. In the first cycle, the shift register module S(i) is in a working state corresponding to the first to sixth periods P1-P6, and in the rest cycles, the shift register module S(i) is in a standby state corresponding to the seventh period P7.

An operation of the third stage shift register module S3 is as follows.

FIG. 4 shows waveforms of the first to fourth clock signals VCK1-VCK4 provided to the first to fourth clock terminals CK1-CK4, and the signals of the initial terminal INT3, the first output terminal G5, the second output terminal G6, the reset terminal RES3, the first node N1, and the second node N2.

In the first period P1 as an initial period, the initial terminal INT3 receives the signal of the second output terminal G4 of the second stage shift register module S2 (the high-level signal of the second output terminal G4) as the initial signal, the voltage of the first node N1 is pulled up to a first voltage V1. The fifth transistor T5 and the eighth transistor T5A turn on. The third transistor T3 turns on based on the voltage of the first node N1 for clamping the voltage of the second node N2 at the predetermined value. The signals of the first and second clock terminals CK1-CK2 are low level, the first and second output terminals G5-G6 are thus low level. Thus, the third stage shift register module S3 is initialized.

In the second period P2, the signal of the first clock terminal CK1 is at high level, and the signal of the second clock terminal CK2 is at low level. The second output terminal G4 of the second stage shift register module S2 is at low level, and the voltage of the first node N1 is pulled up to a second voltage V2. The fifth transistor T5 and the eighth transistor T5A remain turned-on. The second voltage V2 is larger than the first voltage V1. The signal of the first output terminal G5 is at the high level according to the signal of the first clock terminal CK1. The signal of the second output terminal G6 is at low level according to the signal of the second clock terminal CK2. The voltage of the second node N2 remains low level.

In the third period P3, the signals of the first and second clock terminals CK1-CK2 are at the low level, and the second output terminal G4 of the second stage shift register module S2 is at the low level. The voltage of the first node N1 is pulled down to the first voltage V1. The fifth transistor T5 and the eighth transistor T5A remain turned-on. The signal of the first output terminal G5 is at the low level according to the signal of the first clock terminal CK1. The signal of the second output terminal G6 is at the low level according to the signal of the second clock terminal CK2. The voltage of the second node N2 remains low level.

In the fourth period P4, the signal of the first clock terminal CK1 is at the low level, and the signal of the second clock terminal CK2 is at the high level. The second output terminal G4 of the second stage shift register module S2 is at the low level, and the voltage of the first node N1 is pulled up to the second voltage V2. The fifth transistor T5 and the eighth transistor T5A remain turned-on. The signal of the first output terminal G5 is at the low level according to the signal of the first clock terminal CK1. The signal of the second output terminal G6 is at the high level according to the signal of the second clock terminal CK2. The voltage of the second node N2 remains low level.

In the fifth period P5, the signals of the first and second clock terminals CK1-CK2 are low level, and the second output terminal G4 of the second stage shift register module S2 is low level. The voltage of the first node N1 is pulled down to the first voltage V1. The fifth transistor T5 and the eighth transistor T5A remain turned-on. The signal of the first output terminal G5 is at the low level according to the signal of the first clock terminal CK1. The signal of the second output terminal G6 is at the low level according to the signal of the second clock terminal CK2. The voltage of the second node N2 remains low level.

In the sixth period P6, the reset terminal RES3 receives the signal of the first output terminal G7 of the fourth stage shift register module S4 as the reset signal (the first output terminal G7 outputs high level), the second transistor T2 turns on, the voltage of the first node N1 is pulled down to the predetermined value. The voltage of the second node N2 remains low level, thereby the third stage shift register module S3 resets.

In the seventh period P7, the signal of one of the first and second clock terminals CK1-CK2 is high level, and the signal of the other is low level. The fourth transistor T4 turns on, and the voltage of the first node N1 is pulled down to the predetermined value. The fifth transistor T5 and the eighth transistor T5A turn off. The signals of the first and second output terminals G5-G6 remain low level to avoid outputting noise.

In one embodiment, the first voltage V1 and the second voltage V2 are larger than the threshold voltages of the fifth transistor T5 and the eighth transistor T5A.

Based on the structure of the shift register 111, each shift register module S(i) outputs signals to two scan lines in a time-division manner. The number of shift register modules S1-S(n) is reduced, and an area of the non-display region is also reduced for achieving a narrow bezel. Each shift register module S(i) receives four non-overlapping clock signals. The fourth transistor T4 ensures the output stability of each shift register module, and output of noise is avoided.

Figure 5:
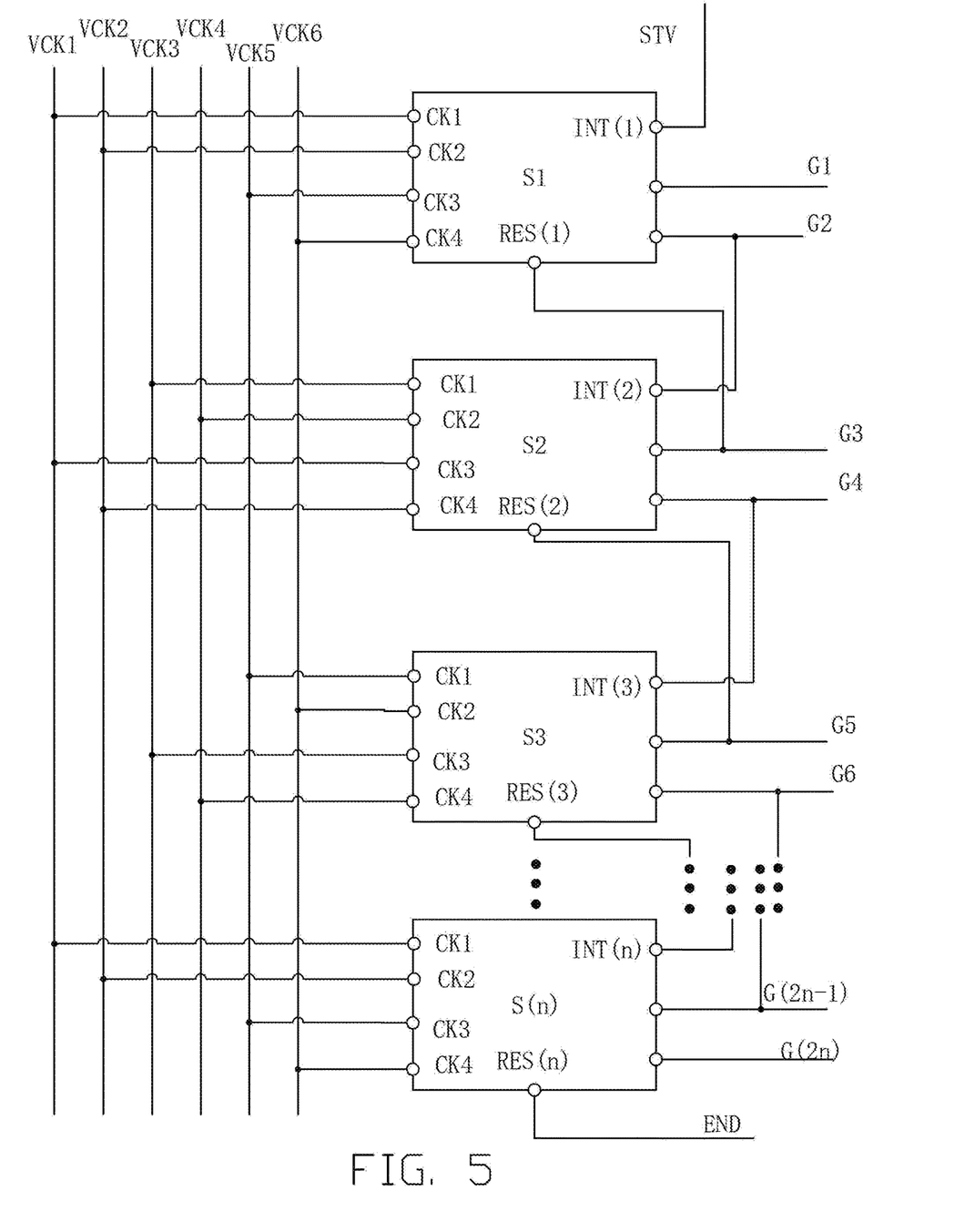
FIG. 5 is a diagram view of a second embodiment of the shift register of FIG. 1, the shift register includes a number of shift register modules.

FIG. 5 shows a second embodiment of the shift register 111. The shift register 111 includes some shift register modules S1-S(n) connected in multiple stages. Each shift register module S(i) is electrically connected with two scan lines $SL_{(2i-1)}$-$SL_{(2)}$ through a first output terminal G(2i−1) and a second output terminal G(2i) respectively. The first output terminal G(2i−1) is electrically connected to the scan line $SL_{(2i-1)}$, and the second output terminal G(2i) is electrically connected to the scan line $SL_{(2i)}$. Signals of the first output terminal G(2i-1) and the second output terminal G(2i) partly overlap with each other. Each shift register module S(i) receives four signals from the time controller 130. The time controller 130 provides the first to sixth clock signals VCK1-VCK6. The signals of the first to sixth clock signals VCK1-VCK6 are shifted in order. A signal of each of first to sixth clock signals VCK1-VCK6 is partly overlapped with the signal of the adjacent one of the first to sixth clock signals VCK1-VCK6. The signal is a high level. For example, the effective signal of the first clock signal VCK1 is partly overlapped with the effective signal of the second clock signal VCK2 and is partly overlapped with the effective signal of the sixth clock signal VCK6. In one embodiment, there are three combinations of the shift register module S(i) and the first to sixth clock signals VCK1-VCK6. First to fourth clock terminals CK1-CK4 of each shift register module S1, S4, . . . , S(1+3*(i−1)), which are positioned apart from each other at an specified value, receive the first and second clock signals VCK1-VCK2 and the fifth and sixth clock signals VCK5-VCK6. The first to fourth clock terminals CK1-CK4 of the shift register modules S2, S5, . . . , S(2+3*(i−1)) which are positioned apart from each other at the specified value, receive the third and fourth clock signals VCK3-VCK4 and the first and second clock signals VCK1-VCK2. The first to fourth clock terminals CK1-CK4 of the shift register modules S3, S6, . . . , S(3+3*(i−1)), which are positioned apart from each other at the specified value receive the fifth and sixth clock signals VCK5-VCK6 and the third and fourth clock signals VCK3-VCK4. It is understood that, an initial terminal INT1 of the first stage shift register module S1 receives a start signal STV. The signal outputted by the second output terminal OUT(2i) of each shift register module S(i) is provided to the initial terminal INT(i+1) of the following shift register module S(i+1) as an initializing signal, and a reset terminal RES(i) of each shift register module S(i) is electrically connected to a first output terminal OUT(2i-3) of the anterior stage shift register module S(i−1) for receiving a reset signal. It is understood that, the reset terminal RES2 of the second stage shift register module S2 receives the reset signal from the first output terminal OUT1 of the first stage shift register module S1. In other embodiment, number of the clock signals provided by the time controller 130 is m, and the shift register modules are divided into m/2 groups.

Figure 6:
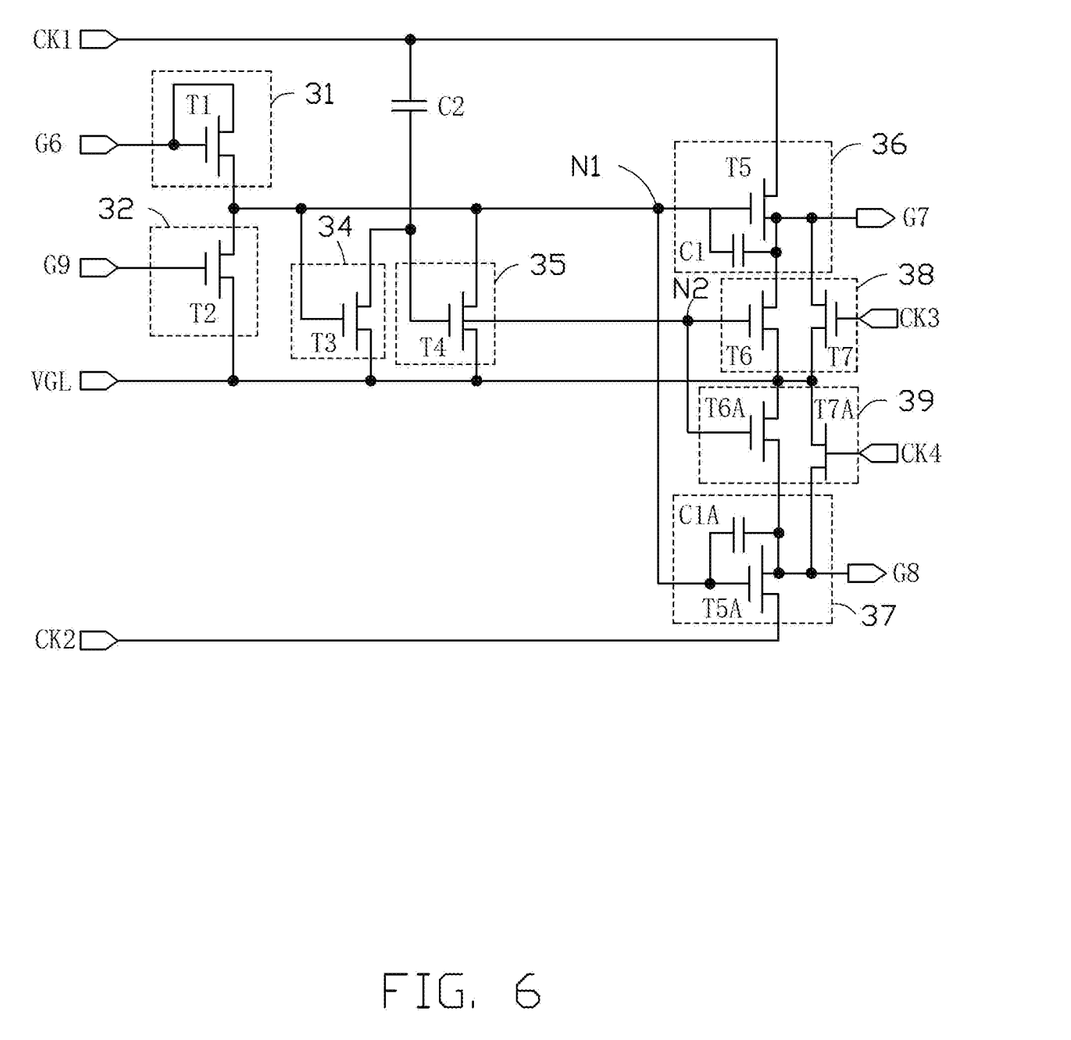
FIG. 6 is a circuit diagram view of the fourth stage shift register module of FIG. 5.

FIG. 6 shows a circuit diagram of the fourth stage shift register module S4. Each shift register module Si has same electrical structure and includes the same elements. The fourth stage shift register module S4 includes an initial circuit 31 with the initial terminal INT4, a reset circuit 32 with the reset terminal RES4, a first control circuit 34, a second control circuit 35, a first output circuit 36 with the first output terminal G7, a second output terminal G8, a first pull-down circuit 38, and a second output terminal 39.

The initial circuit 31 receives the initial signal through the initial terminal INT4 for initiating the third stage shift register module S4. The initial circuit 31 includes a first transistor T1. A control terminal of the first transistor T1 receives the signal of the second output terminal OUT6 of the anterior shift register module S3 as the initial signal. A first connection of the first transistor T1 is electrically connected to the first output circuit 36 and the second output terminal 37 through a first node N1. A second connection of the first transistor T1 is electrically connected to the first control terminal of the first transistor T1.

The reset circuit 32 receives the reset signal through the reset terminal RES3 for resetting the third stage shift register module S4. The reset circuit 32 includes a second transistor T2. A control terminal of the second transistor T2 receives the signal of the first output terminal OUT9 of the following fifth stage shift register module S5 as the reset signal. A first connection terminal of the second transistor T2 is electrically connected to a ground terminal VGL. A second connection terminal of the second transistor T2 is electrically connected to the first output circuit 36 and the second output terminal 37 through a first node N1. The first node N1 is electrically connected between the first connection terminal of the first transistor T1 and the second connection terminal of the second transistor T2.

The first control circuit 34 pulls down a voltage of a second node N2 connected between the first control 34 and the first pull-down circuit 38, when the voltage of the first node N1 is larger than a predetermined value. The first control circuit 34 includes a third transistor T3. A control terminal of the third transistor T3 is electrically connected to the first node N1. A first connection terminal of the third transistor T3 is electrically connected to the ground terminal VGL. A second connection terminal of the third transistor T3 is electrically connected to a first clock terminal CK1 through a first filter capacitor C2 and is further electrically connected to a second clock terminal CK2 through a second filter capacitor C2A.

The second control circuit 35 clamps the voltage of the first node N1 at the predetermined value based on the signals of the first clock terminal CK1 and the second clock terminal CK2. The second control circuit 35 includes a fourth transistor T4. A control terminal of the fourth transistor T4 is electrically connected to the second node N2, the first clock terminal CK1 through the first filter capacitor C2, and the second clock terminal CK2 through the second filter capacitor C2A. A first connection terminal of the fourth transistor T4 is electrically connected to the ground terminal VGL. A second connection terminal of the fourth transistor T4 is electrically connected to the first node N1.

The first output circuit 36 controls the first output terminal G7 to output a signal synchronously with the signal of the first clock terminal CK1, based on the signals of the initial terminal INT4 and the reset terminal RES4. The first output circuit 36 includes a fifth transistor T5 and a first capacitor C1. A first control terminal of the fifth transistor T5 is electrically connected to the first node N1. A first connection terminal of the fifth transistor T5 is electrically connected to the first clock terminal CK1. A second connection terminal of the fifth transistor T5 is electrically connected to the first output terminal G7 and the first pull-down circuit 38. Opposite terminals of the first capacitor C1 are respectively electrically connected to the first control terminal and the second connection terminal of the fifth transistor T5.

The first pull-down circuit 38 pulls down the voltage of the first output terminal G7 based on the voltage of the second node N2 and a signal of a third clock terminal CK3. The first pull-down circuit 38 includes a sixth transistor T6 and a seventh transistor T7. A first control terminal of the sixth transistor T6 is electrically connected to the second node N2. A first connection terminal of the sixth transistor T6 is electrically connected to the ground terminal VGL. A second connection terminal of the sixth transistor T6 is electrically connected to the first output terminal G7. A first control terminal of the seventh transistor T7 is electrically connected to the third clock terminal CK3. A first connection terminal of the seventh transistor T7 is electrically connected to the ground terminal VGL. A second connection terminal of the seventh transistor T7 is electrically connected to the first output terminal G7.

The second output circuit 37 controls the second output terminal G8 to output a signal synchronously with the signal of the second clock terminal CK2, based on the signals of the initial terminal INT4 and the reset terminal RES4. The second output circuit 37 includes an eighth transistor T5A and a second capacitor C1A. A first control terminal of the eighth transistor T5A is electrically connected to the first node N1. A first connection terminal of the eighth transistor T5A is electrically connected to the second clock terminal CK2. A second connection terminal of the eighth transistor T5A is electrically connected to the second output terminal G8 and the second pull-down circuit 39. Opposite terminals of the second capacitor C1A are respectively electrically connected to the first control terminal and the second connection terminal of the eighth transistor T5A.

The second pull-down circuit 39 pulls down the voltage of the second output terminal G8 based on the voltage of the second node N2 and a signal of a fourth clock terminal CK4. The second pull-down circuit 39 includes a ninth transistor T6A and a tenth transistor T7A. A first control terminal of the ninth transistor T6A is electrically connected to the second node N2. A first connection terminal of the ninth transistor T6A is electrically connected to the ground terminal VGL. A second connection terminal of the ninth transistor T6A is electrically connected to the second output terminal G8. A first control terminal of the tenth transistor T7A is electrically connected to the fourth clock terminal CK4. A first connection terminal of the tenth transistor T7A is electrically connected to the ground terminal VGL. A second connection terminal of the tenth transistor T7A is electrically connected to the second output terminal G8.

Figure 7:
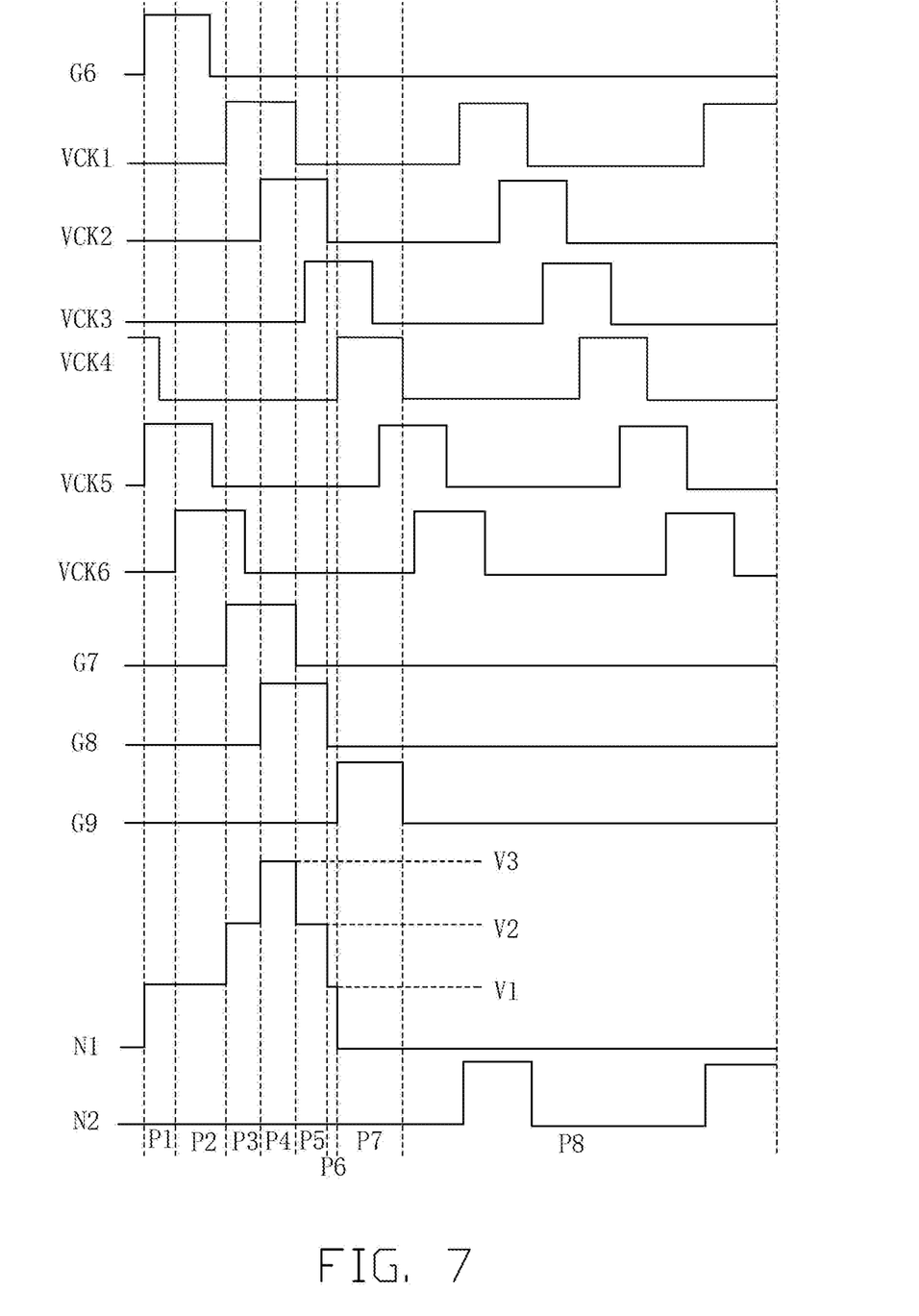
FIG. 7 is a timing chart showing waveforms of the fourth shift register module of FIG. 6.

Each shift register module S(i) operates under first to eighth periods P1-P8 in one frame. In the first to fifth periods P1-P5, the voltage of the first node N1 is larger than a threshold voltage of the third transistor T3, thus the third transistor T3 turns on, and the voltage of the second node N2 is clamped at the predetermined value. In one embodiment, the predetermined value is 0 volt. Thus, the high-level signals of the first clock terminal CK1 or the second clock terminal CK2 provided to the second node N2 in the second to fifth periods P2-P5 do not pull up the voltage of the second node N2. During the eighth period P8, the fourth transistor T4 turns on according to the signal of the first clock terminal CK1, and the voltage of the first node N1 is clamped at the predetermined value, to avoid the first output terminal G7 and the second output terminal G8 outputting noise. In one frame, the signals of the first to fourth clock terminals CK1-CK4 are shifted in order during several cycles. In each cycle, the signals of the first to fourth clock terminals CK1-CK4 are effective for a certain time duration. In the first cycle, the shift register module S(i) is in a working state corresponding to the first to seventh periods P1-P7, and in the rest cycles, the shift register module S(i) is in a standby state corresponding to the eighth period P8.

An operation of the fourth stage shift register module S4 is as follows.

FIG. 7 shows waveforms of the first to fourth clock signals VCK1-VCK4 provided to the first to fourth clock terminals CK1-CK4, and the signals of the initial terminal INT4, the first output terminal G7, the second output terminal G8, the reset terminal RES4, the first node N1, and the second node N2.

In the first period P1 as an initial period, the initial terminal INT4 receives the signal of the second output terminal G6 of the third stage shift register module S3 (the high level signal of the second output terminal G6) as the initial signal, and the voltage of the first node N1 is pulled up to a first voltage V1. The fifth transistor T5 and the eighth transistor T5A turn on. The third transistor T3 turns on based on the voltage of the first node N1 for clamping the voltage of the second node N2 at the predetermined value. The signals of the first and second clock terminals CK1-CK2 are low level, as are the signals of the first and second output terminals G7-G8. Thus, the third stage shift register module S4 is initialized.

In the second period P2, the signals of the first and second clock terminals CK1-CK2 are at the high level, the signal of the second output terminal G6 of the third stage shift register module S3 is at high level, and the voltage of the first node N1 remains at the first voltage V1. The fifth transistor T5 and the eighth transistor T5A remain turned-on. The signals of the first and second output terminals G7-G8 remain at low level. The voltage of the second node N2 remains at the predetermined value.

In the third period P3, the signal of the first clock terminal CK1 is at the high level, the signal of the second clock terminal CK2 is at the low level, and the signal of the second output terminal G6 of the third stage shift register module S3 is at the low level. The voltage of the first node N1 is pulled up to a second voltage V2, the second voltage V2 is larger than the first voltage V1. The signal of the first output terminal G7 is at the high level according to the signal of the first clock terminal CK1. The signal of the second output terminal G8 is at the low level according to the signal of the second clock terminal CK2. The voltage of the second node N2 remains low level.

In the fourth period P4, the signals of the first and second clock terminals CK1-CK2 are at the high level, and the second output terminal G6 of the third stage shift register module S3 is at the low level. The voltage of the first node N1 is pulled up to a third voltage V3 according to the signals of the first and second clock terminals CK1-CK2. The third voltage V3 is larger than the second voltage V2. The fifth transistor T5 and the eighth transistor T5A remain turned-on. The signals of the first and second output terminals G7-G8 are at the high level according to the signal of the first and second clock terminals CK1-CK2. The voltage of the second node N2 remains at the low level.

In the fifth period P5, the signal of the first clock terminal CK1 is at the low level, and the signal of the second clock terminal CK2 is at the high level. The second output terminal G6 of the third stage shift register module S3 is at the low level, and the voltage of the first node N1 is pulled down to the second voltage V2. The fifth transistor T5 and the eighth transistor T5A remain turned-on. The signal of the first output terminal G7 is at the low level according to the signal of the first clock terminal CK1. The signal of the second output terminal G8 is at the high level according to the signal of the second clock terminal CK2. The voltage of the second node N2 remains at the low level.

In the sixth period P6, the signals of the first and second clock terminals CK1-CK2 are low level, and the second output terminal G6 of the third stage shift register module S3 is low level. The voltage of the first node N1 is pulled down to the first voltage V1. The fifth transistor T5 and the eighth transistor T5A remain turned-on. The signals of the first and second output terminals G7-G8 are at the low level according to the signal of the first and second clock terminals CK1-CK2. The voltage of the second node N2 remains low level.

In the seventh period P7, the reset terminal RES4 receives the signal of the first output terminal G9 of the fifth stage shift register module S5 as the reset signal (the signal of the first output terminal G9 being high level), the second transistor T2 turns on, and the voltage of the first node N1 is pulled down to the predetermined value. The voltage of the second node N2 remains at the low level, thus the fourth stage shift register module S4 is reset.

In the eighth period P8, the signal of one of the first and second clock terminals CK1-CK2 is at the high level, the fourth transistor T4 turns on, and the voltage of the first node N1 is pulled down to the predetermined value. The fifth transistor T5 and the eighth transistor T5A turn off. The signals of the first and second output terminals G7-G8 remains low level to avoid output of noise.

In one embodiment, the first voltage V1, the second voltage V2, and the third voltage V3 are larger than the threshold voltages of the fifth transistor T5 and the eighth transistor T5A.

The structure of the shift register 111 is such that each shift register module S(i) outputs signals to two scan lines in a time-division manner, the number of shift register modules S1-S(n) is reduced, and an area of the non-display region is also reduced for achieving a narrow bezel. Each shift register module S(i) receives four clock signals, which are partly overlapped with each other. The fourth transistor T4 ensures the output stability of each shift register module, and output of noise is avoided.

While various exemplary and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A shift register used in a display apparatus, the shift register comprising:
    a plurality of cascade-connected shift register modules, each shift register module electrically coupled to a first scan line and a second scan line through a first output terminal and a second output terminal, each shift register module is controlled by first to fourth clock signals, each shift register module comprising:
    an initial circuit with an initial terminal, configured to receive an initial signal for activating the shift register module;
    a reset circuit with a reset terminal, configured to receiving a reset signal for resetting the shift register module;
    a first output circuit with the first output terminal, the first output circuit connected with the initial circuit and the reset circuit through a first node, configured to control the first output terminal to output an effective signal based on a signal of a first clock terminal;
    a second output circuit with a second output terminal, the second output circuit connected with the initial circuit, the reset circuit, and the first node, and configured to control the second output terminal to output an effective signal based on a signal of a second clock terminal;
    wherein the first to fourth clock signals are pulse signals with a specified frequency, and the first clock signal is shifted by a specified phase serving as the second clock signal; there being no overlap between the signals of any two of the first to fourth clock signals;
    wherein in one frame each shift register module operates in order under first to seventh periods; the first to sixth periods correspond to a first cycle; a voltage of the first node is at a first voltage during the first period, the third period, and the fifth period; the voltage of the first node being pulled up to a second voltage during the second period and the fourth period.

2. The shift register of claim 1, wherein the shift register module further comprises a first control circuit, a first pull-down circuit, and a second pull-down circuit; the first pull-down circuit is electrically connected to the first control circuit through a second node; the first pull-down circuit pulls down the voltage of the first output terminal according to the signal of a third clock terminal; the second pull-down circuit pulls down the voltage of the second output terminal according to the signal of a fourth clock terminal; the first control circuit clamps a voltage of the second node at a predetermined value when the voltage of the first node is larger than a predetermined value.

3. The shift register of claim 2, wherein the shift register module further comprises a second control circuit; the second control circuit is electrically connected with the first control circuit and the first node; the second control circuit clamps the voltage of the first node at the predetermined value according to the effective signal of the first clock terminal or the second clock terminal.

4. The shift register of claim 1, wherein the first control circuit comprises a first transistor; a control terminal of the first transistor is electrically connected to the first node; a first connection terminal of the first transistor is electrically connected to a ground terminal; a second connection terminal of the first transistor is electrically connected to the first clock terminal through a first filter capacitor, and is further electrically connected to a second clock terminal through a second filter capacitor; the second control circuit comprises a second transistor; a control terminal of the second transistor is electrically connected to the second node; a first connection terminal of the second transistor is electrically connected to a ground terminal; a second connection terminal of the second transistor is electrically connected to the first node.

5. A display apparatus comprising:
    a plurality of scan lines in a display region;
    a time controller in a non-display region, configured to provide clock signals;
    a scan driving circuit configured to provide signals to the scan lines based on the clock signals from the time controller; the scan driving circuit comprising a shift register with a plurality of cascade-connected shift register modules, each of the shift register module electrically coupled to a first scan line and a second scan line through a first output terminal and a second output terminal, each of the shift register module is controlled by first to fourth clock signals, each of the shift register module comprising:
    an initial circuit with an initial terminal, configured to receive an initial signal for activating the shift register module;
    a reset circuit with a reset terminal, configured to receiving a reset signal for resetting the shift register module;
    a first output circuit with the first output terminal, the first output circuit connected with the initial circuit and the reset circuit through a first node, configured to control the first output terminal to output an effective signal based on a signal of a first clock terminal;

a second output circuit with a second output terminal, the second output circuit connected with the initial circuit, the reset circuit, and the first node, configured to control the second output terminal to output an effective signal based on a signal of a second clock terminal;

wherein the first to fourth clock signals are pulse signals with a specified frequency; the first clock signal is shifted by a specified phase serving as the second clock signal, and is partly overlapped with the second clock signal; the third clock signal is shifted by a specified phase serving as the fourth clock signal, and is partly overlapped with the fourth clock signal;

wherein in one frame each shift register module operates in order under first to eighth periods; the first to seventh periods correspond to a first cycle; a voltage of the first node is at a first voltage during the first period, the second period, and the sixth period; the voltage of the first node is pulled up to a second voltage during the third period and the fifth period; the voltage of the first node is pulled up to a third voltage during the fourth period.

6. The display apparatus of claim 5, wherein the shift register module further comprises a first control circuit, a first pull-down circuit, and a second pull-down circuit; the first pull-down circuit is electrically connected to the first control circuit through a second node; the first pull-down circuit pulls down the voltage of the first output terminal according to the signal of a third clock terminal; the second pull-down circuit pulls down the voltage of the second output terminal according to the signal of a fourth clock terminal; the first control circuit clamps a voltage of the second node at a predetermined value when the voltage of the first node is larger than a predetermined value.

7. The display apparatus of claim 6, wherein the shift register module further comprises a second control circuit; the second control circuit is electrically connected with the first control circuit and the first node; the second control circuit clamps the voltage of the first node at the predetermined value according to the effective signal of the first clock terminal or the second clock terminal.

8. The display apparatus of claim 7, wherein the second control circuit comprises a transistor; a control terminal of the transistor is electrically connected to the second node; a first connection terminal of the transistor is electrically connected to a ground terminal; a second connection terminal of the transistor is electrically connected to the first node.

9. The display apparatus of claim 5, wherein the first control circuit comprises a transistor; a control terminal of the transistor is electrically connected to the first node; a first connection terminal of the transistor is electrically connected to a ground terminal; a second connection terminal of the transistor is electrically connected to the first clock terminal through a first filter capacitor, and is further electrically connected to a second clock terminal through a second filter capacitor.

10. The display apparatus of claim 5, wherein the time controller provides six clock signals to the shift register; an effective signal in one of the six clock signals is partly overlapped with the effective signal in adjacent one of the six clock signals.

* * * * *